United States Patent
Tsurume et al.

(10) Patent No.: US 8,426,293 B2
(45) Date of Patent: Apr. 23, 2013

(54) IC CHIP AND ITS MANUFACTURING METHOD

(75) Inventors: Takuya Tsurume, Atsugi (JP); Koji Dairiki, Isehara (JP); Naoto Kusumoto, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 866 days.

(21) Appl. No.: 11/629,861

(22) PCT Filed: Jul. 6, 2005

(86) PCT No.: PCT/JP2005/012875
§ 371 (c)(1),
(2), (4) Date: Dec. 18, 2006

(87) PCT Pub. No.: WO2006/006611
PCT Pub. Date: Jan. 19, 2006

(65) Prior Publication Data
US 2008/0265376 A1  Oct. 30, 2008

(30) Foreign Application Priority Data
Jul. 9, 2004  (JP) ................... 2004-203906

(51) Int. Cl.
*H01L 21/301*  (2006.01)
(52) U.S. Cl.
USPC ........... 438/464; 438/460; 438/462; 438/463; 438/113; 218/618; 218/E21.238

(58) Field of Classification Search .......... 257/618, 257/E21.238; 438/464, 460, 462, 463, 113
See application file for complete search history.

(56) References Cited

U.S. PATENT DOCUMENTS

| | | | |
|---|---|---|---|
| 6,030,485 A | 2/2000 | Yamada | |
| 6,376,278 B1 * | 4/2002 | Egawa et al. | 438/110 |
| 6,451,671 B1 | 9/2002 | Yamada | |
| 6,528,382 B2 | 3/2003 | Yamauchi et al. | |

(Continued)

FOREIGN PATENT DOCUMENTS

| | | |
|---|---|---|
| CN | 1350701 | 5/2002 |
| EP | 1494272 A | 1/2005 |

(Continued)

OTHER PUBLICATIONS

International Search Report (Application No. PCT/JP2005/012875) dated Oct. 25, 2005.

(Continued)

*Primary Examiner* — Junghwa M Im
(74) *Attorney, Agent, or Firm* — Eric J. Robinson; Robinson Intellectual Property Law Office, P.C.

(57) ABSTRACT

It is an object of the present invention to decrease a unit cost of an IC chip and to achieve the mass-production of IC chips. According to the present invention, a substrate having no limitation in size, such as a glass substrate, is used instead of a silicon substrate. This achieves the mass-production and the decrease of the unit cost of the IC chip. Further, a thin IC chip is provided by grinding and polishing the substrate such as the glass substrate.

11 Claims, 16 Drawing Sheets

U.S. PATENT DOCUMENTS

| | | |
|---|---|---|
| 6,682,963 B2 | 1/2004 | Ishikawa |
| 6,699,774 B2 | 3/2004 | Takyu et al. |
| 6,777,310 B2 | 8/2004 | Inuzuka |
| 6,827,636 B2 | 12/2004 | Yamada |
| 6,831,727 B2 | 12/2004 | Akiyama et al. |
| 6,956,638 B2 | 10/2005 | Akiyama et al. |
| 6,977,710 B2 | 12/2005 | Akiyama et al. |
| 7,109,071 B2 | 9/2006 | Ishikawa |
| 7,211,880 B2 | 5/2007 | Izumi |
| 7,335,578 B2 | 2/2008 | Fukuoka et al. |
| 2002/0030189 A1* | 3/2002 | Ishikawa .................. 257/59 |
| 2002/0192927 A1* | 12/2002 | Yamada .................. 438/460 |
| 2004/0063249 A1* | 4/2004 | Lin et al. ................. 438/110 |
| 2004/0129450 A1* | 7/2004 | Yamazaki et al. ........... 174/250 |
| 2004/0164302 A1 | 8/2004 | Arai et al. |

FOREIGN PATENT DOCUMENTS

| | | |
|---|---|---|
| JP | 60-189228 A | 9/1985 |
| JP | 04-219955 A | 8/1992 |
| JP | 07-030209 A | 1/1995 |
| JP | 08-124881 A | 5/1996 |
| JP | 09-312349 A | 12/1997 |
| JP | 11-020360 | 1/1999 |
| JP | 11-045866 A | 2/1999 |
| JP | 11-067881 A | 3/1999 |
| JP | 11-144019 A | 5/1999 |
| JP | 11-212116 | 8/1999 |
| JP | 11-260770 A | 9/1999 |
| JP | 2000-007020 A | 1/2000 |
| JP | 2000-124164 A | 4/2000 |
| JP | 2000-208446 A | 7/2000 |
| JP | 2001-024010 A | 1/2001 |
| JP | 2002-164512 A | 6/2002 |
| JP | 2002-343747 A | 11/2002 |
| JP | 2003-016414 A | 1/2003 |
| JP | 2003-209160 A | 7/2003 |
| JP | 2003-229384 A | 8/2003 |
| JP | 2003-256794 A | 9/2003 |
| JP | 2003-257897 A | 9/2003 |
| JP | 2003-280035 A | 10/2003 |
| JP | 2004-094492 | 3/2004 |
| JP | 2004-146778 A | 5/2004 |
| JP | 2004-282050 | 10/2004 |
| WO | WO-03/085714 | 10/2003 |
| WO | WO-2004/027874 | 4/2004 |

OTHER PUBLICATIONS

Written Opinion (Application No. PCT/JP2005/012875) dated Oct. 25, 2005.

Office Action (Application No. 200580023217.3) Dated Feb. 15, 2008.

Korean Office Action (Application No. 2007-7002802) Dated Aug. 4, 2011.

Korean Office Action (Application No. 2011-7023062) Dated Dec. 20, 2011.

* cited by examiner

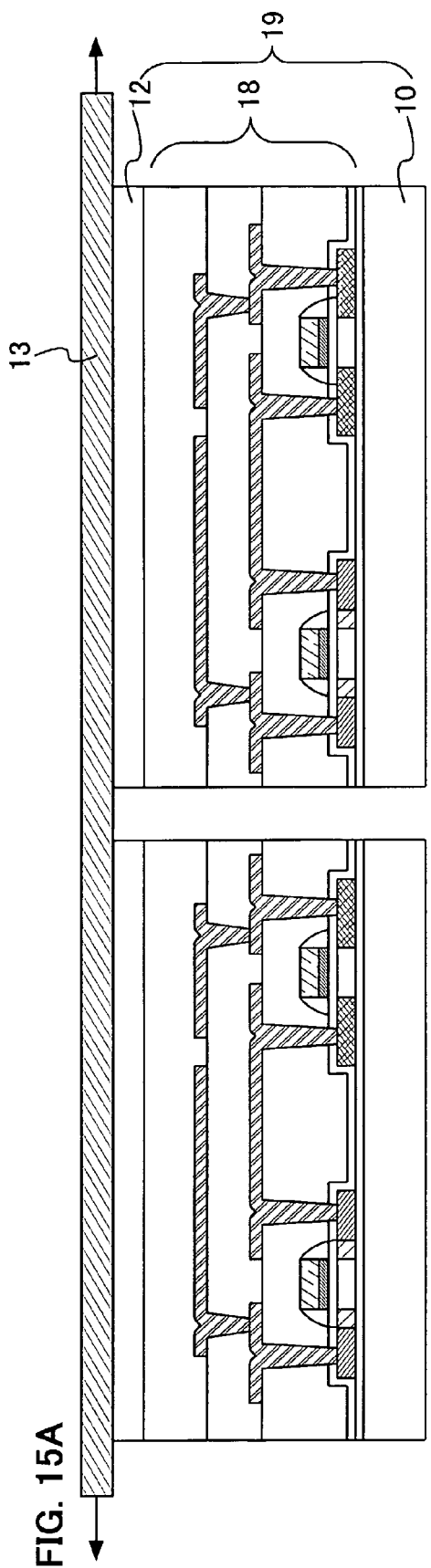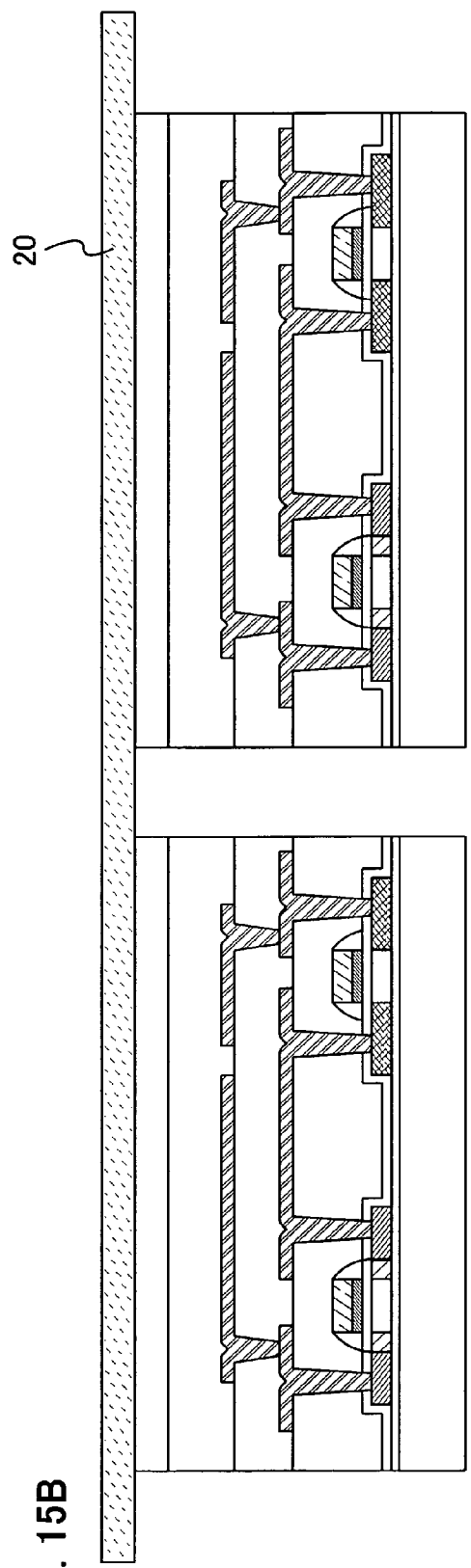
FIG. 15A
FIG. 15B

IC CHIP AND ITS MANUFACTURING METHOD

TECHNICAL FIELD

The present invention relates to an IC chip and its manufacturing method.

BACKGROUND ART

In recent years, an IC chip for sending and receiving data has been extensively developed and such an IC chip is referred to as an RF tag, a radio frequency tag, an electronic tag, a radio frequency processor, a radio frequency memory, or the like (for example, see Reference 1: Japanese Patent Application Laid-Open No. 2004-282050 p. 11-14, FIG. 5). Most of IC chips currently in practical application use silicon substrates. Such IC chips are provided with thin thicknesses by forming elements over one surface of silicon substrates and then grinding and polishing a surface opposite to the one surface.

DISCLOSURE OF INVENTION

Although the decrease in the cost of IC chips has been promoted with the expansion of the IC chips, it has been difficult to decrease the unit cost of the IC chip because silicon substrates are expensive. Further, silicon substrates in the market are circular in shape, and the diameter is as small as approximately 12 inch (30 cm) at maximum. For this reason, silicon substrates have the limitation in its size, which makes the mass production difficult.

In view of the above problem, it is an object of the present invention to decrease the unit cost of the IC chip and to achieve the mass production of the IC chip.

The present invention achieves the mass production of the IC chip and the lower unit cost of the IC chip by using a substrate not having limitation in size, for example a glass substrate, instead of the silicon substrate. Further, a thin IC chip is provided by grinding and polishing the substrate such as the glass substrate.

A method for manufacturing an IC chip according to the present invention comprises the steps of forming a plurality of thin film integrated circuits over one surface of a substrate having an insulating surface (one plane of a substrate), providing a first film so as to cover the thin film integrated circuits, providing a second film so as to cover the first film, grinding a surface opposite to the one surface of the substrate (the other plane of the substrate), polishing the ground surface of the substrate, cutting the substrate, an insulating film included in the thin film integrated circuit, and the first film so as to form a plurality of IC chips in which the substrate, the thin film integrated circuit, and the first film are stacked, expanding the second film so as to form a space between the IC chips, separating the IC chip from the second film, adhering one plane of the IC chip to a first base, and adhering the other plane of the IC chip to a second base.

In the above process, the step of separating the IC chip from the second film is conducted by taking the IC chip from the second film with the use of pick-up means after irradiating the second film with light, and the step of adhering the one plane of the IC chip to the first base is conducted by adhering the one plane of the IC chip to the first base with the use of pick-up means.

Moreover in the above process, the step of separating the IC chip from the second film and the step of adhering the one plane of the IC chip to the first base are conducted in such a way that the second film is irradiated with light, the first base is put so as to cover the one plane of the IC chip, the one plane of the IC chip is adhered to the first base by heating the first base, and then the first base with the IC chip adhered and the second film are separated.

A method for manufacturing an IC chip according to the present invention comprises the steps of forming a plurality of thin film integrated circuits over one surface of a substrate having an insulating surface (one plane of the substrate), providing a film so as to cover the thin film integrated circuits, grinding a surface opposite to the one surface of the substrate (the other plane of the substrate), polishing the ground surface of the substrate, cutting the substrate and an insulating film included in the thin film integrated circuit so as to form a plurality of IC chips in which the substrate and the thin film integrated circuits are stacked, and expanding the film so as to form a space between the IC chips.

After the above process, the step of cutting the film so as to separate the IC chips, the step of providing the IC chip with the film adhered to a concave portion of a first tape, and the step of providing a second tape so as to contact the first tape are conducted.

In the above process, the surface opposite to the one surface of the substrate is ground until the thickness of the substrate becomes 100 μm or less. Further, the ground surface of the substrate is polished until the thickness of the substrate becomes 20 μm or less.

An IC chip according to the present invention comprises a substrate, a thin film integrated circuit formed over the substrate, and a film to cover the thin film integrated circuit, wherein the substrate, the thin film integrated circuit, and the film are sandwiched between a first base and a second base, wherein the first base contacts the substrate, wherein the second base contacts the film, and wherein the thickness of the substrate is 20 μm or less.

An IC chip according to the present invention comprises a substrate and a thin film integrated circuit formed over the substrate which are sandwiched between a first base and a second base, wherein the first base contacts the substrate, wherein the second base contacts the thin film integrated circuit, and wherein the thickness of the substrate is 20 μm or less.

According to the present invention which employs a substrate not having the limitation in size, for example a glass substrate, the unit cost of the IC chip can be decreased compared with the case of using the silicon substrate, and the mass-production of the IC chip becomes possible.

The present invention in which the substrate such as the glass substrate is ground and polished can provide a thin IC chip.

BRIEF DESCRIPTION OF DRAWINGS

In the accompanying drawings:

FIGS. 15A and 15B show a method for manufacturing an IC chip according to the present invention (Embodiment Mode 4)

BEST MODE FOR CARRYING OUT THE INVENTION

Figure 1A:
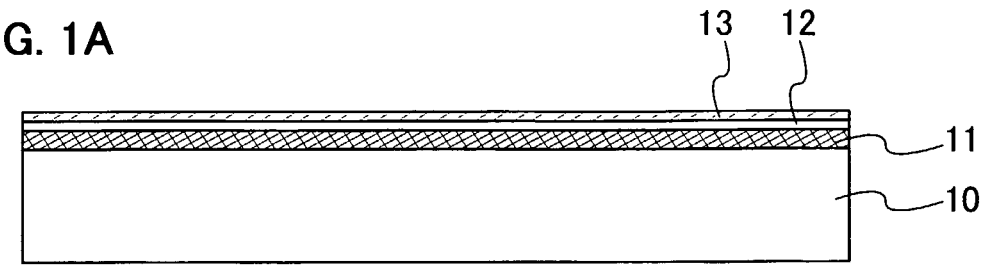
FIGS. 1A to 1D show a method for manufacturing an IC chip according to the present invention (Embodiment Mode 1)

Embodiment Modes and Embodiments of the present invention are hereinafter described in detail with reference to the drawings. However, the present invention is not limited to the following description, and it is to be understood by those skilled in the art that the mode and detail of the present invention can be changed variously within the scope of the present invention. Therefore, the present invention is not construed as being limited to the description of the following Embodiment Modes and Embodiments. Further, in the structure of the present invention hereinafter described, the same parts are denoted with the same reference numerals throughout the drawings.

Embodiment Mode 1

An embodiment mode of the present invention is described with reference to the drawings.

A layer 11 including a plurality of thin film integrated circuits is formed over one surface of a substrate 10 having an insulating surface (refer to FIG. 1A). The substrate 10 corresponds to a glass substrate, a quartz substrate, a plastic substrate, an acrylic substrate (a kind of plastic substrate), or the like. The substrate 10 can be easily manufactured to have a length of 1 m or more on a side, and can have a desired shape such as a square or circular shape. Therefore, when the substrate 10 has a size of 1 m or more on a side, the productivity can be drastically increased. This characteristic is a significant advantage compared with the case of taking out IC chips from a circular silicon substrate.

The layer 11 including a plurality of thin film integrated circuits comprises at least a plurality of insulating films, a semiconductor layer and a conductive layer which constitute a plurality of elements, and a conductive layer serving as an antenna. Specifically, the layer 11 comprises a first insulating film serving as a foundation film, a plurality of elements provided over the first insulating film, a second insulating film covering the plurality of elements, a first conductive layer connecting to the plurality of elements and in contact with the second insulating film, a third insulating film covering the first conductive layer, a second conductive layer serving as an antenna in contact with the third insulating film, and a fourth insulating film covering the second conductive layer. More specific structure is later described in Embodiment Mode 4.

Next, a first film 12 is provided so as to cover the layer 11 including the plurality of thin film integrated circuits. The first film 12 is a protective film to protect the layer 11 including the plurality of thin film integrated circuits.

Subsequently, a second film 13 is provided so as to cover the first film 12. The second film 13 comprises a vinyl chloride resin, a silicon resin, or the like and has properties of expanding when being pulled. Therefore, the second film 13 is also referred to as an expand film. Further, the second film 13 preferably has properties that the adhesion force is high in a normal state but becomes lower by the irradiation of light. Specifically, a UV tape whose adhesion force becomes lower by the irradiation of ultraviolet light is preferably used.

Figure 1B:
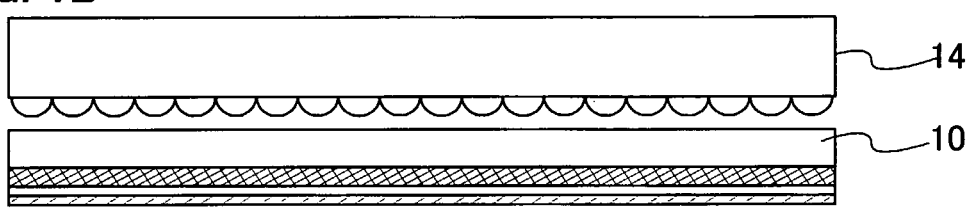

Next, the surface opposite to the one surface of the substrate 10 is ground by grinding means 14 (refer to FIG. 1B). The substrate 10 is preferably ground until the thickness thereof becomes 100 µm or less. Generally, in this grinding step, the surface of the substrate 10 is ground by rotating one or both of a stage with the substrate 10 fixed and the grinding means 14. The grinding means 14 corresponds to, for example, a grindstone.

Figure 1C:
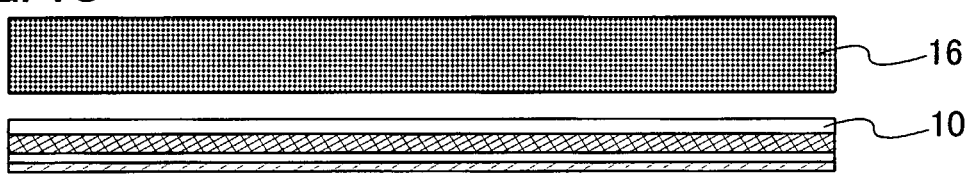

Next, the ground surface of the substrate 10 is polished by polishing means 16 (refer to FIG. 1C). The substrate 10 is preferably polished until the thickness thereof becomes 20 µm or less. This polishing step is conducted, in the same way as the grinding step, by rotating one or both of the stage with the substrate 10 fixed and the polishing means 16. The polishing means 16 corresponds to, for example, a grindstone. After that, though not illustrated, the substrate is washed as necessary in order to remove the dust generated in the grinding and polishing steps.

Subsequently, the substrate 10, the layer 11 including the plurality of thin film integrated circuits, and the first film 12 are cut by cutting means 17. The layer 11 including the plurality of thin film integrated circuits are cut at the boundary of the thin film integrated circuits (between the thin film integrated circuits) so that the respective thin film integrated circuits are separated from each other. Further, the insulating films provided to the layer 11 including the plurality of thin film integrated circuits are cut without cutting the element provided to the layer 11 including the plurality of thin film integrated circuits. Consequently, after the cutting step, a plurality of thin film integrated circuits 18 are formed.

Figure 1D:
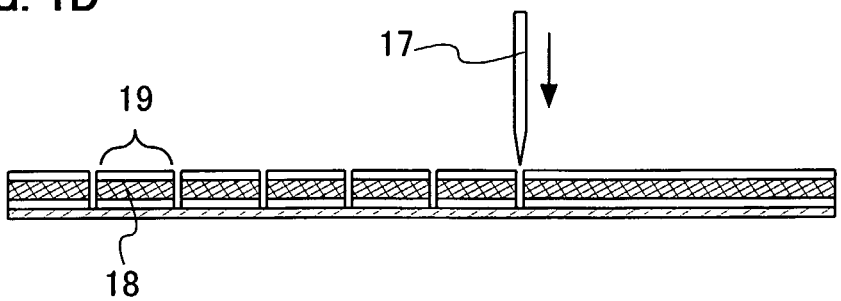

Then, a plurality of IC chips 19 are formed in which the substrate 10, the thin film integrated circuits 18, and the first film 12 are stacked (refer to FIG. 1D). The cutting means 17 corresponds to a dicer, a laser, a wire saw, or the like. In this step, the second film 13 is not cut.

Figure 2A:
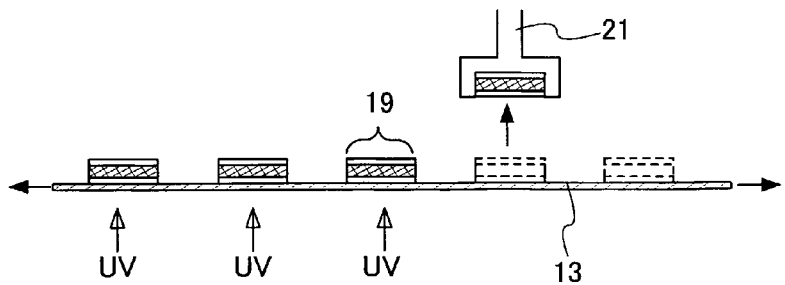
FIGS. 2A to 2C show a method for manufacturing an IC chip according to the present invention (Embodiment Mode 1)

Next, the second film 13 is expanded so as to form a space between the IC chips 19 (refer to FIG. 2A). At this time, the second film 13 is preferably expanded uniformly in a direction of the plane in order to make each space between the IC chips uniform. Subsequently, the second film 13 is irradiated with light. If the second film 13 is a UV tape, the second film 13 is irradiated with ultraviolet light. Then, the adhesion force of the second film decreases, and the adhesiveness between the second film 13 and the IC chip 19 is lowered. Thus, a state is obtained in which the IC chip 19 can be separated from the second film 13 by physical means.

In the above process, the step of irradiating the second film 13 with light is performed after the step of expanding the second film 13. However, the present invention is not limited to this order, and the step of irradiating the second film 13 with light may be performed before the step of expanding the second film 13.

Subsequently, the following step can be conducted in two different methods, and one of them is described first.

In this method, first, the IC chip 19 is taken out by pick-up means 21 in order to separate the IC chip 19 from the second film 13. Next, the IC chip 19 is provided over a first base 20 by the pick-up means 21 in order to adhere one plane of the IC chip 19 to the first base 20 (refer to FIG. 2B). Here, the pick-up means which is referred to as a moving means or a transferring means, corresponds to a contact-type transferring (moving) means for lifting up with a pin or an arm or for vacuum contact using a vacuum mechanism, or corresponds to a noncontact-type transferring (moving) means using magnetic force, air pressure, electrostatic force as adsorptive power or force for lift.

Figure 2B:
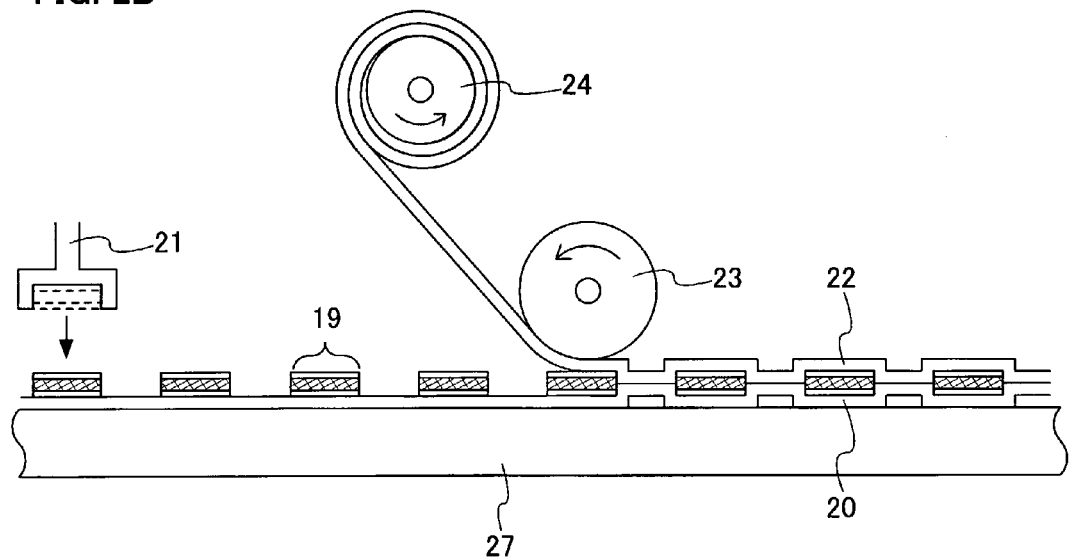

Subsequently, the other plane of the IC chip 19 is adhered to a second base 22 (FIG. 2B). This step is conducted using a laminate device which comprises a supply roll 24 and a laminate roll 23. The supply roll 24 has the second base 22 twining therearound, and the laminate roll 23 has one or both of heating means and pressurizing means. The IC chip 19 is laminated continuously by rotating the laminate roll 23 and the supply roll 24 sequentially. Specifically, the other plane of the IC chip 19 is adhered to the second base 22 by the laminate roll 23, and the IC chip 19 is sealed by the first base 20 and the second base 22 according to one or both of the heating process and the pressurizing process.

The laminate process is hereinafter described in more detail. The laminate roll 23 and the supply roll 24 are rotated sequentially, and the supply roll 24 supplies the second base 22 to the laminate roll 23. The first base 20 with the plurality of IC chips 19 provided is delivered sequentially by delivering means 27. The laminate process corresponds to the process in which one or both of the heating process and the pressurizing process are conducted to the IC chips 19, the first base 20, and the second base 22 by the laminate roll 23 and the delivering means 27 when the first base 20 with the IC chips adhered passes between the laminate roll 23 and the delivering means 27. By the laminate process, the IC chips 19 are sealed by the first base 20 and the second base 22. It is to be noted that the delivering means 27 corresponds to a belt conveyer, a plurality of rollers, or a robot arm. When the heating process is conducted by the laminate roll 23 and the delivering means 27, the laminate roll 23 has heating means corresponding to a heater using electrically-heating wire, oil, or the like.

Figure 2C:
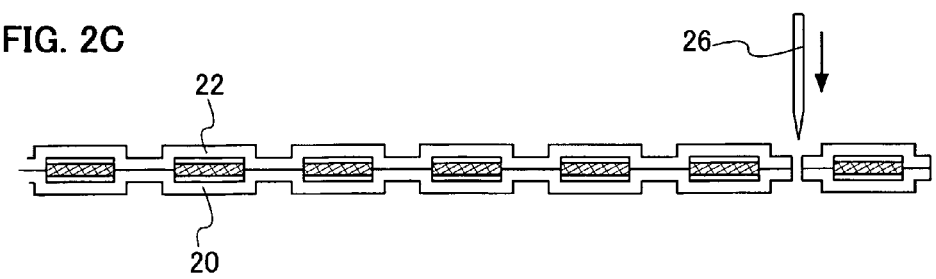

Subsequently, the first base 20 and the second base 22 are cut by cutting means 26 (refer to FIG. 2C). Then, the IC chips 19 sealed by the first base 20 and the second base 22 are completed.

Next, the other method is described.

Figure 3A:
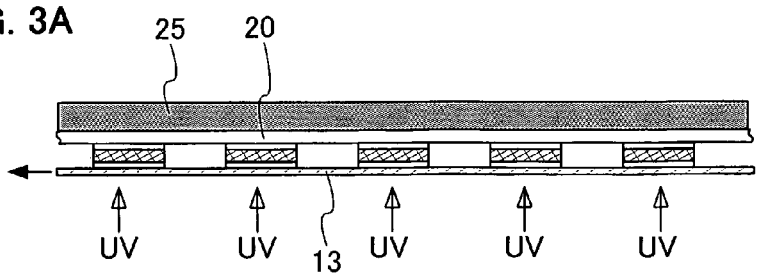
FIGS. 3A to 3C show a method for manufacturing an IC chip according to the present invention (Embodiment Mode 1)
Figure 3B:
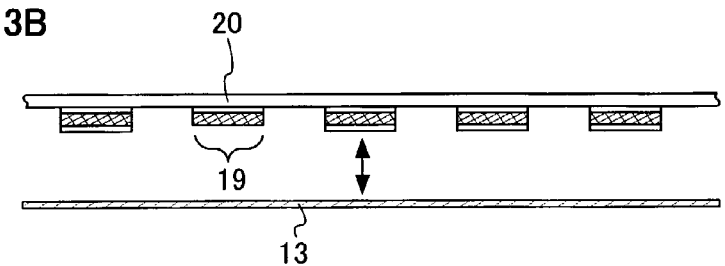

First, the first base 20 is provided so as to cover the one plane of the IC chip 19 (refer to FIG. 3A). Next, the one plane of the IC chip 19 is adhered to the first base 20 by heating the first base 20 with heating means 25. Then, the first base 20 with the IC chips 19 adhered and the second film 13 are separated in order to separate the IC chips 19 from the second film 13 (refer to FIG. 3B).

Figure 3C:
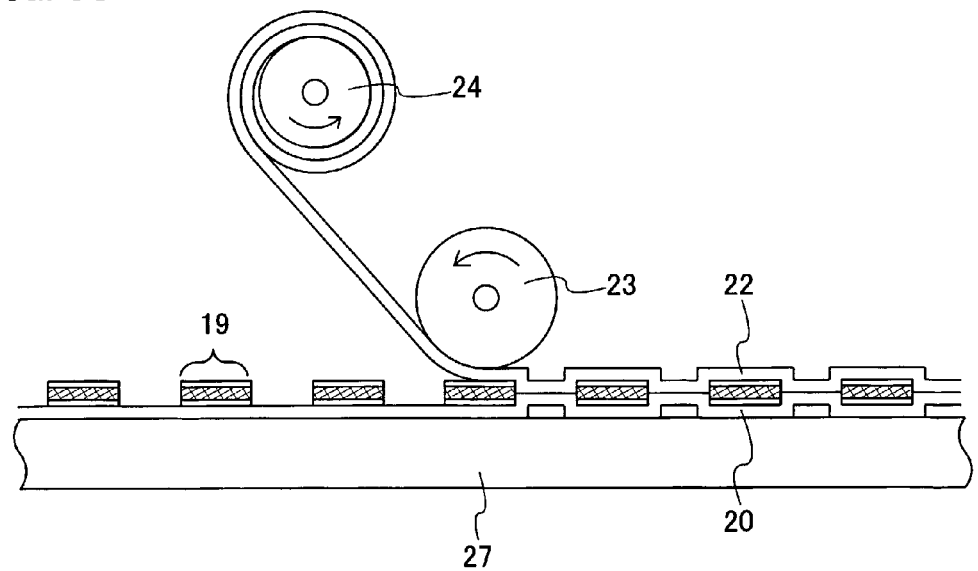

Next, the other plane of the IC chip 19 is adhered to the second base 22, and the IC chips 19 are sealed by the first base 20 and the second base 22 (refer to FIG. 3C). Subsequently, the first base 20 and the second base 22 are cut. This step is the same as that in the aforesaid method.

According to the latter method, the first base 20 is provided so as to cover the one plane of the IC chip 19 after irradiating the second film 13 with light (refer to FIG. 3A). However, the present invention is not limited to this order. The second film 13 may be irradiated with light after providing the first base 20 so as to cover the one plane of the IC chip 19 and heating the first base 20.

In the above process, the step of cutting the substrate 10 (refer to FIG. 1D) is conducted after completing the grinding step (refer to FIG. 1B) and the polishing step (refer to FIG. 1C) of the substrate 10. However, the present invention is not limited to this order. The grinding step and the polishing step of the substrate 10 may be conducted after the cutting step of the substrate 10.

The IC chip 19 completed through the above process is thin and light-weight. Because of the thinness, the design quality is not lowered even when the IC chip 19 is mounted to an object.

Embodiment Mode 2

An embodiment mode of the present invention is described with reference to the drawings.

Figure 4A:
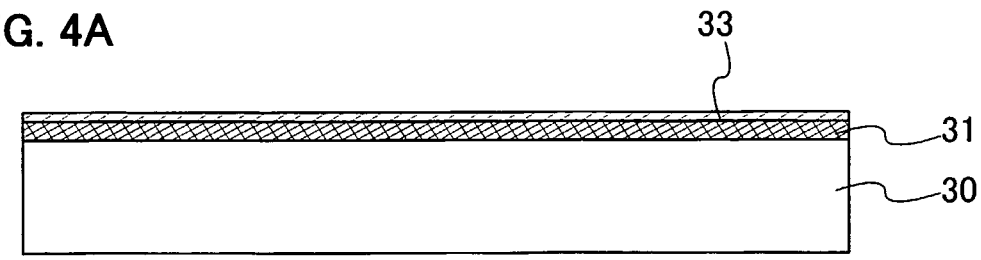
FIGS. 4A to 4D show a method for manufacturing an IC chip according to the present invention (Embodiment Mode 2)

A layer 31 including a plurality of thin film integrated circuits is formed over one surface of a substrate 30 (FIG. 4A). The substrate 30 corresponds to a glass substrate, a quartz substrate, a plastic substrate, an acrylic substrate, or the like. The substrate 30 can be easily manufactured to have a length of 1 m or more on a side, and can have a desired shape such as a square or circular shape. Therefore, when the substrate 30 has a size of 1 m or more on a side, the productivity can be drastically increased. This characteristic is a significant advantage compared with the case of taking out the IC chips from a circular silicon substrate.

The layer 31 including the plurality of thin film integrated circuits comprises at least a plurality of insulating films, a semiconductor layer and a conductive layer which constitute a plurality of elements, and a conductive layer serving as an antenna.

Next, a film 33 is provided so as to cover the layer 31 including the plurality of thin film integrated circuits. The film 33 comprises a vinyl chloride resin, a silicone resin, or the like and has properties of expanding when being pulled. Therefore, the film 33 is also referred to as an expand film. Further, the film 33 preferably has properties that the adhesion force is high in a normal state but becomes lower by the irradiation of light. Specifically, a UV tape whose adhesion force becomes lower by the irradiation of ultraviolet light is preferably used. In this embodiment mode, unlike the previous embodiment mode, the protective film is not pasted.

Figure 4B:
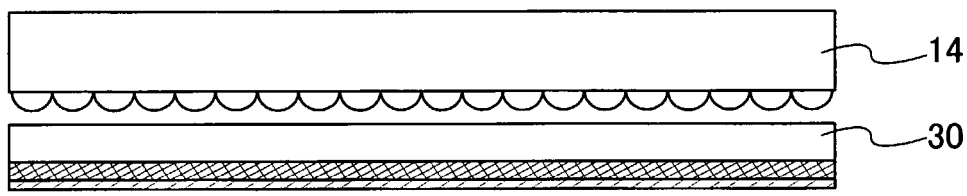

Next, the surface opposite to the one surface of the substrate 30 is ground by grinding means 14 (refer to FIG. 4B). The substrate 30 is preferably ground until the thickness thereof becomes 100 µm or less.

Figure 4C:
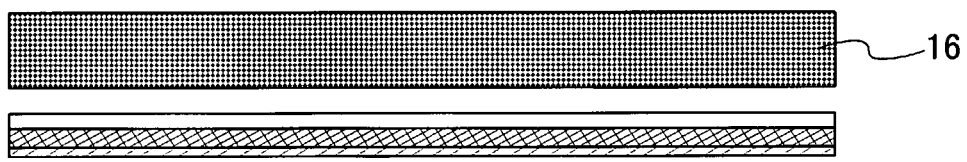

Next, the ground surface of the substrate 30 is polished by polishing means 16 (refer to FIG. 4C). The substrate 30 is preferably polished until the thickness thereof becomes 20 µm or less.

Figure 4D:
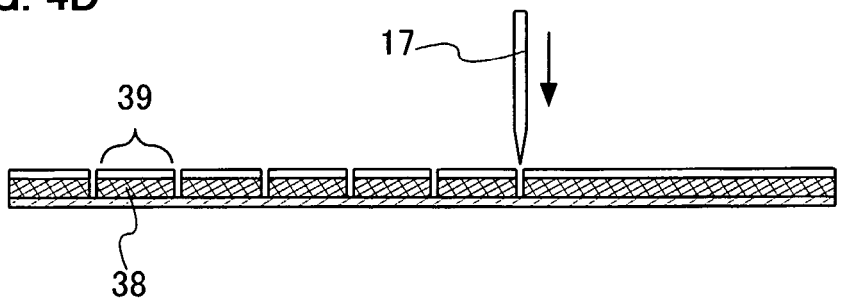

Subsequently, the substrate 30 and the layer 31 including the plurality of thin film integrated circuits are cut by cutting means 17. The layer 31 including the plurality of thin film integrated circuits is cut so that the respective thin film integrated circuits are separated from each other. Further, the insulating films provided to the layer 31 including the thin film integrated circuits are cut without cutting the element provided to the layer 31 including the plurality of thin film integrated circuits. Accordingly, after the cutting step, a plurality of thin film integrated circuits 38 are formed. That is to say, a plurality of IC chips 39 are formed in which the substrate 30, the thin film integrated circuits 38, and the film 33 are stacked (refer to FIG. 4D). In this step, the film 33 is not cut.

Figure 5A:
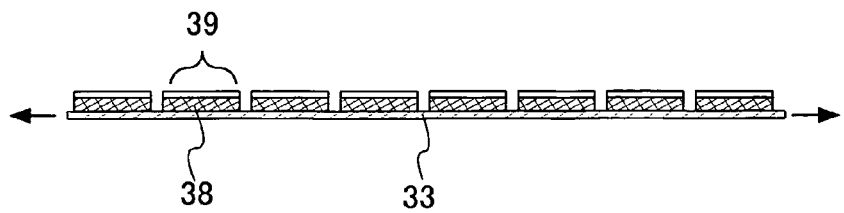
FIGS. 5A to 5D show a method for manufacturing an IC chip according to the present invention (Embodiment Mode 2)

Next, the film 33 is expanded so as to form a space between the IC chips 39 (refer to FIG. 5A). At this time, the film 33 is preferably expanded uniformly in a direction of the plane so as to make each space between the IC chips uniform.

Figure 5B:
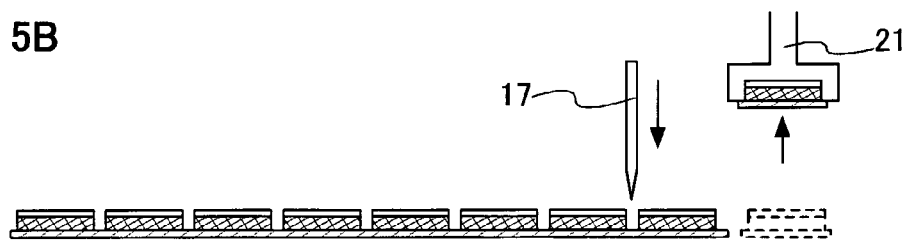

Next, the following step is described in two different cases. First, one case is described in which an adhesive tape is used as the film 33. In this case, the film 33 is cut so that the IC chips 39 are separated from each other by the cutting means 17 (refer to FIG. 5B).

Figure 5C:
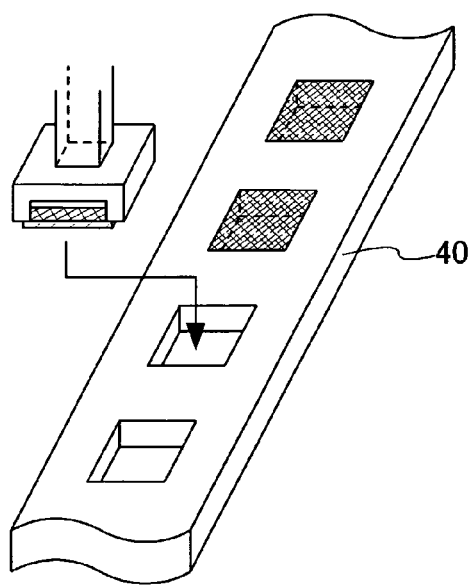

Next, the IC chips 39 with the film 33 adhered thereto are picked up by pick-up means 21. Then, the pick-up means 21 is moved so that the IC chip 39 with the film 33 adhered is provided to a concave portion of a first tape 40 (refer to FIG. 5C).

Figure 5D:
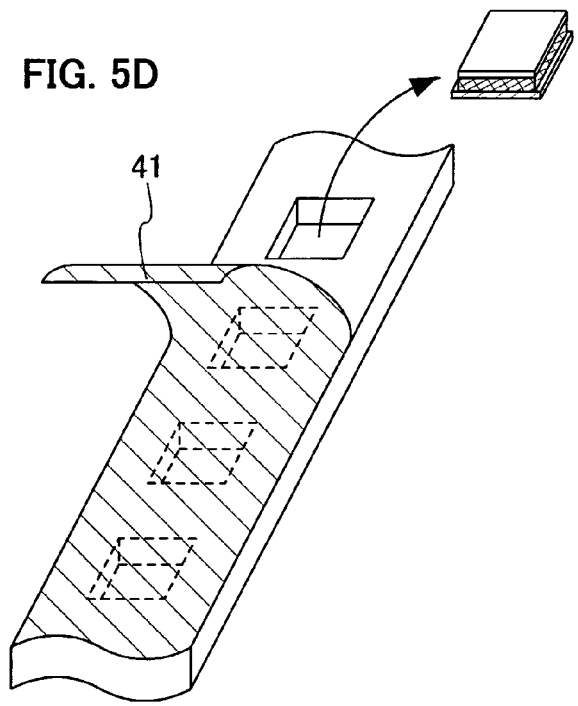

Next, a second tape 41 is provided so as to contact the first tape 40 (refer to FIG. 5D). When the IC chip 39 is to be used, the IC chip 39 is taken out by stripping the second tape 41 from the first tape 40.

Figure 6:
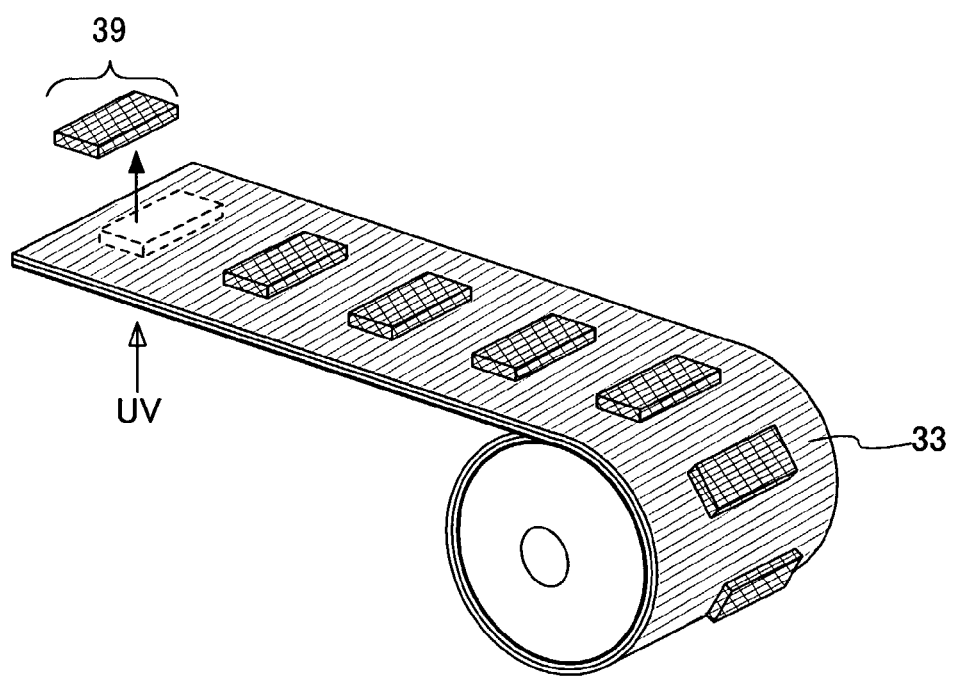
FIG. 6 shows a method for manufacturing an IC chip according to the present invention (Embodiment Mode 2)

Next, the other case is described in which a UV tape is used as the film 33. In this case, after the film 33 is expanded, the film 33 is transformed into a roll-like shape or a sheet-like shape, and the film 33 can be shipped directly (refer to FIG. 6).

The film 33 is irradiated with ultraviolet light selectively when the IC chip 39 is to be used. Then, the adhesiveness between the film 33 and the IC chip 39 is lowered; therefore the IC chip 39 can be separated from the film 33 by physical means. Next, the IC chip 39 is separated completely from the film 33 by separating means such as the pick-up means, and thus the IC chip 39 can be used.

In the above process, the step of cutting the substrate 30 (refer to FIG. 4D) is conducted after completing the grinding step (refer to FIG. 4B) and the polishing step (refer to FIG. 4C) of the substrate 30. However, the present invention is not limited to this order. The grinding step and the polishing step of the substrate 30 may be conducted after the cutting step of the substrate 30.

The IC chips 39 completed through the above process are thin and light-weight. Because of the thinness, the design quality is not lowered even when the IC chip 39 is mounted to an object.

Embodiment Mode 3

An embodiment mode of the present invention is described with reference to the drawings. This embodiment mode describes an operation when using a frame (a carrier jig) in the steps of Embodiment Mode 1.

Figure 7A:
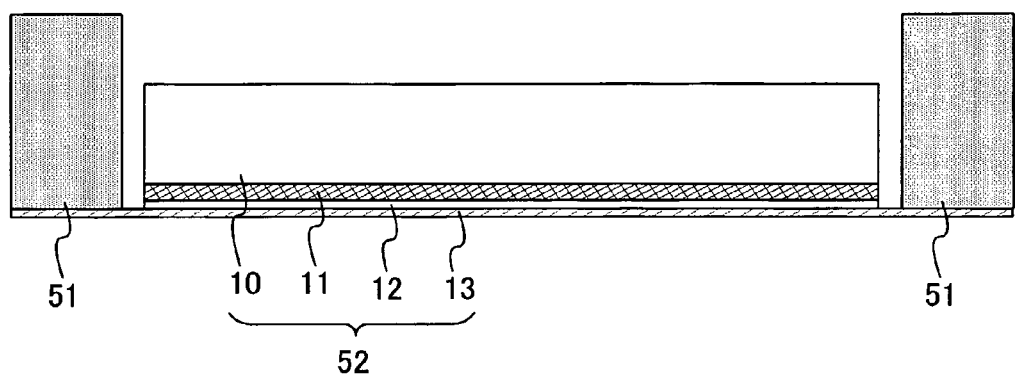
FIGS. 7A and 7B show a method for manufacturing an IC chip according to the present invention (Embodiment Mode 3)
Figure 7B:
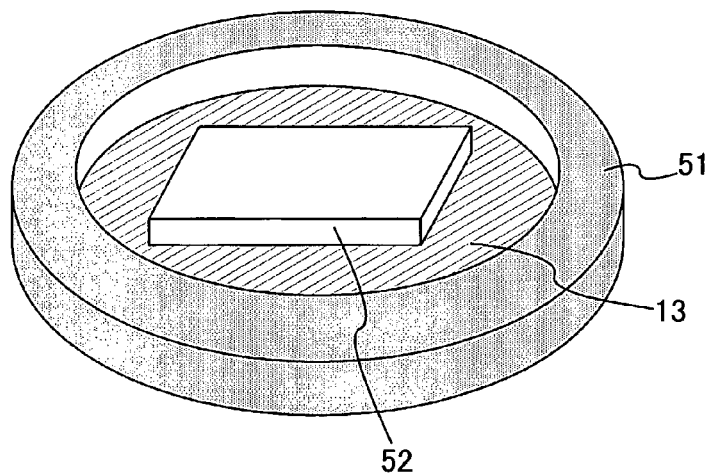

First, as described above, a layer 11 including a plurality of thin film integrated circuits is formed on a substrate 10. Next, a first film 12 is pasted so as to cover the layer 11 including the plurality of thin film integrated circuits. Subsequently, a second film 13 is pasted so as to cover the first film 12. This step is conducted by providing a lamination body 52 including the first film 12, the layer 11 including the plurality of thin film integrated circuits, and the substrate 10 over the second film 13 pasted to a frame 51 (refer to a cross-sectional view of FIG. 7A and a perspective view of FIG. 7B).

Figure 8A:
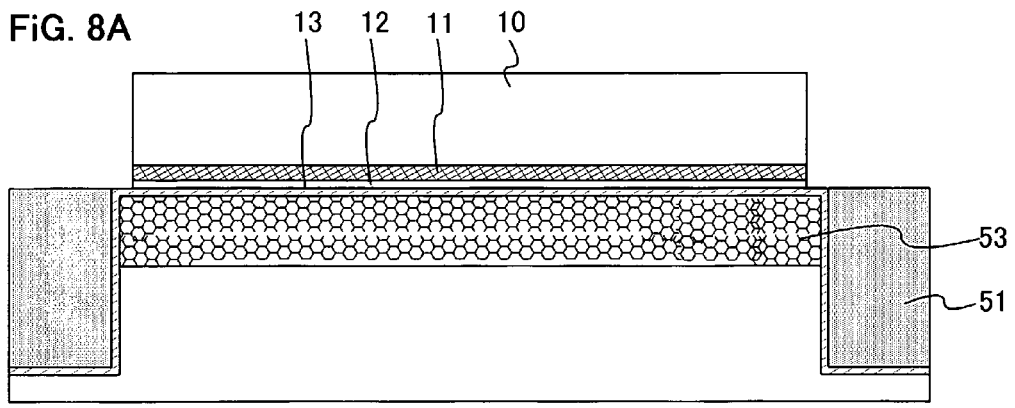
FIGS. 8A to 8C show a method for manufacturing an IC chip according to the present invention (Embodiment Mode 3)

Next, a porous chuck 53 is provided so as to contact one surface of the second film 13 (refer to FIG. 8A). The porous chuck 53 is a porous vacuum chuck mechanism.

Figure 8B:
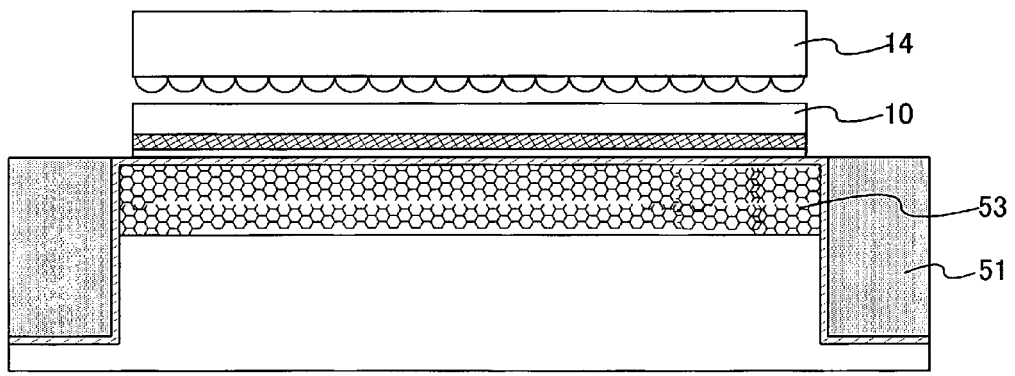

Subsequently, the porous chuck 53 is processed so that the one surface of the substrate 10 becomes higher than one surface of the frame 51. Then, the substrate 10 is fixed by maintaining the state that the porous chuck 53 has been processed (refer to FIG. 8B).

Figure 8C:
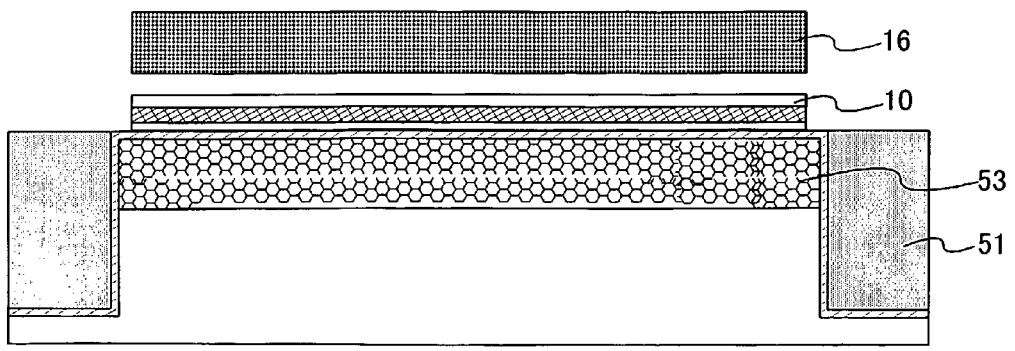

After that, the substrate 10 is ground by grinding means 14. Then, the substrate 10 is polished by polishing means 16 (refer to FIG. 8C).

Figure 9:
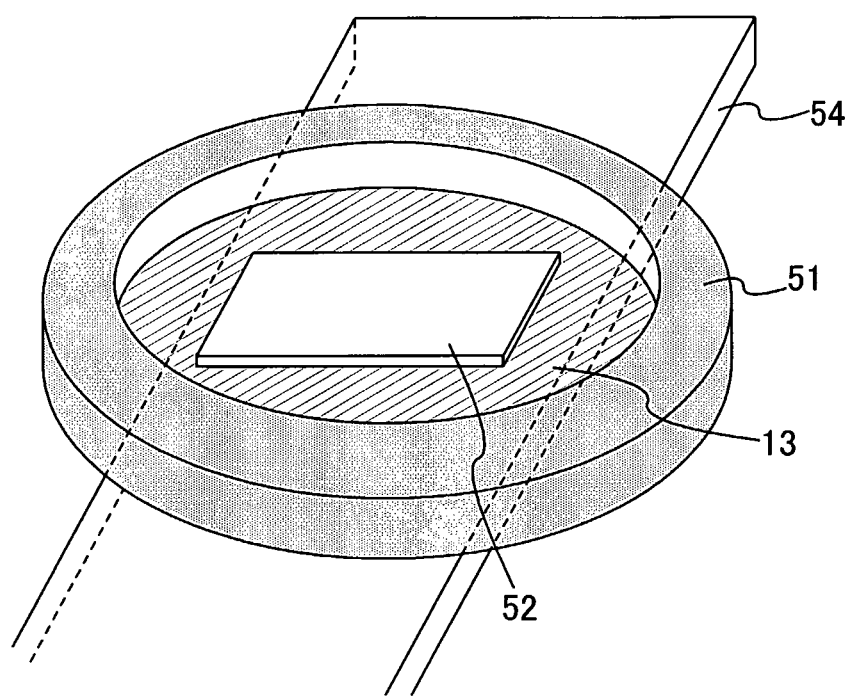
FIG. 9 shows a method for manufacturing an IC chip according to the present invention (Embodiment Mode 3)

Subsequently, the next step is conducted. Since the substrate 10 has been made thinner by the grinding and polishing steps, it is necessary to deliver the substrate 10 so that the substrate 10 does not bend. Consequently, an arm 54 is provided so as to overlap the substrate 10, and the arm 54 and the frame 51 are delivered together (refer to FIG. 9).

The following step may be performed after stripping the lamination body 52 from the frame 51, or performed in such a state that the lamination body 52 is set on the frame 51.

Embodiment Mode 4

An embodiment mode of the present invention is described with reference to the drawings. In this embodiment mode, the structure of a layer 11 including a plurality of thin film integrated circuits formed over one surface of a substrate 10 having an insulating surface is described specifically with reference to the drawings.

Figure 10:
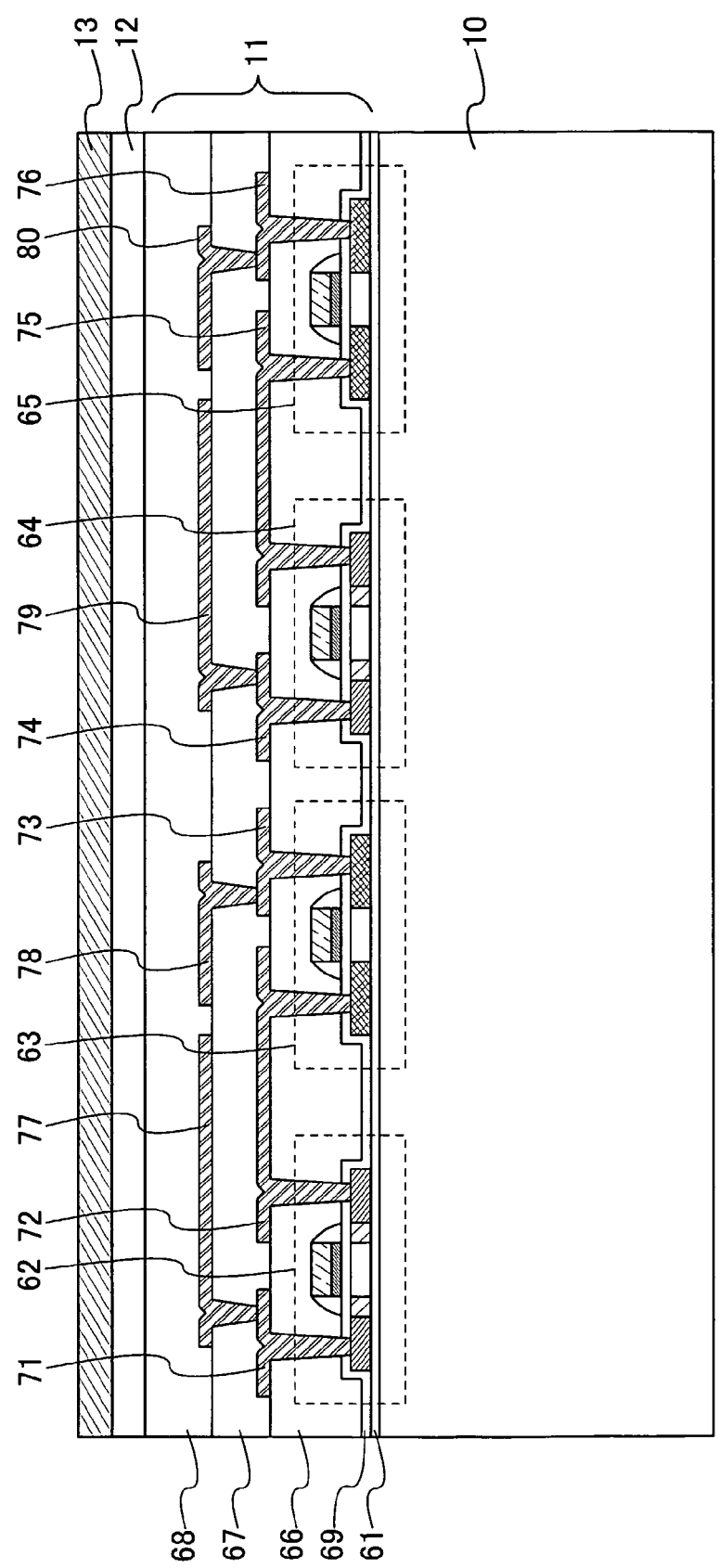
FIG. 10 shows a method for manufacturing an IC chip according to the present invention (Embodiment Mode 4)

An insulating film 61 serving as a foundation film is formed over the substrate 10 (refer to FIG. 10). The insulating film 61 comprises a multilayer film including silicon nitride oxide and silicon oxynitride, a multilayer film including silicon oxynitride, silicon nitride oxide, and silicon oxynitride, or a multilayer film including silicon oxide, silicon nitride oxide, and silicon oxynitride.

Next, a plurality of elements are formed over the insulating film 61. The plurality of elements correspond to, for example, a plurality of elements selected from the group consisting of a thin film transistor, a capacitor element, a resistor element, a diode, and the like. FIG. 10 shows a cross-sectional structure of N-type (N-channel type) thin film transistors 62 and 64, and P-type (P-channel type) thin film transistors 63 and 65. In FIG. 10, each of the thin film transistors 62 and 64 has an LDD (Lightly Doped Drain) structure including a channel-forming region, a lightly-doped impurity region, and a heavily-doped impurity region. Each of the thin film transistors 63 and 65 has a single-drain structure including a channel-forming region and an impurity region.

The structure of the thin film transistor is not limited to the above description, and any structure is applicable, for example the single-drain structure, an off-set structure, the LDD structure, or a GOLD (Gate Overlapped Lightly Doped drain) structure.

Next, an insulating film 66 is formed so as to cover the thin film transistors 62 to 65. Next, opening portions are formed so as to partially expose the impurity regions of the thin film transistors 62 to 65, a conductive film is formed so as to fill the opening portions, and then the conductive film is patterned so that wirings 71 to 76 serving as source or drain wirings are formed.

Next, an insulating film 67 is formed so as to cover the wirings 71 to 76 serving as the source or drain wirings. Then, opening portions are formed so as to partially expose the wirings 71 to 76 serving as the source or drain wirings, a conductive film is formed so as to fill the opening portions, and the conductive film is patterned so that conductive layers 77 to 80 serving as an antenna are formed.

Next, an insulating film 68 is formed so as to cover the conductive layers 77 to 80. Through the above process, the layer 11 including the plurality of thin film integrated circuits is completed over the one surface of the substrate 10 (refer to FIGS. 10 and 1A).

Next, a first film 12 is pasted so as to cover the layer 11 including the plurality of thin film integrated circuits. Then, a second film 13 is pasted over the first film 12 (refer to FIGS.

10 and 1A). Next, the substrate 10 is ground and polished (refer to FIG. 11 and FIGS. 1B and 1C).

Figure 11:
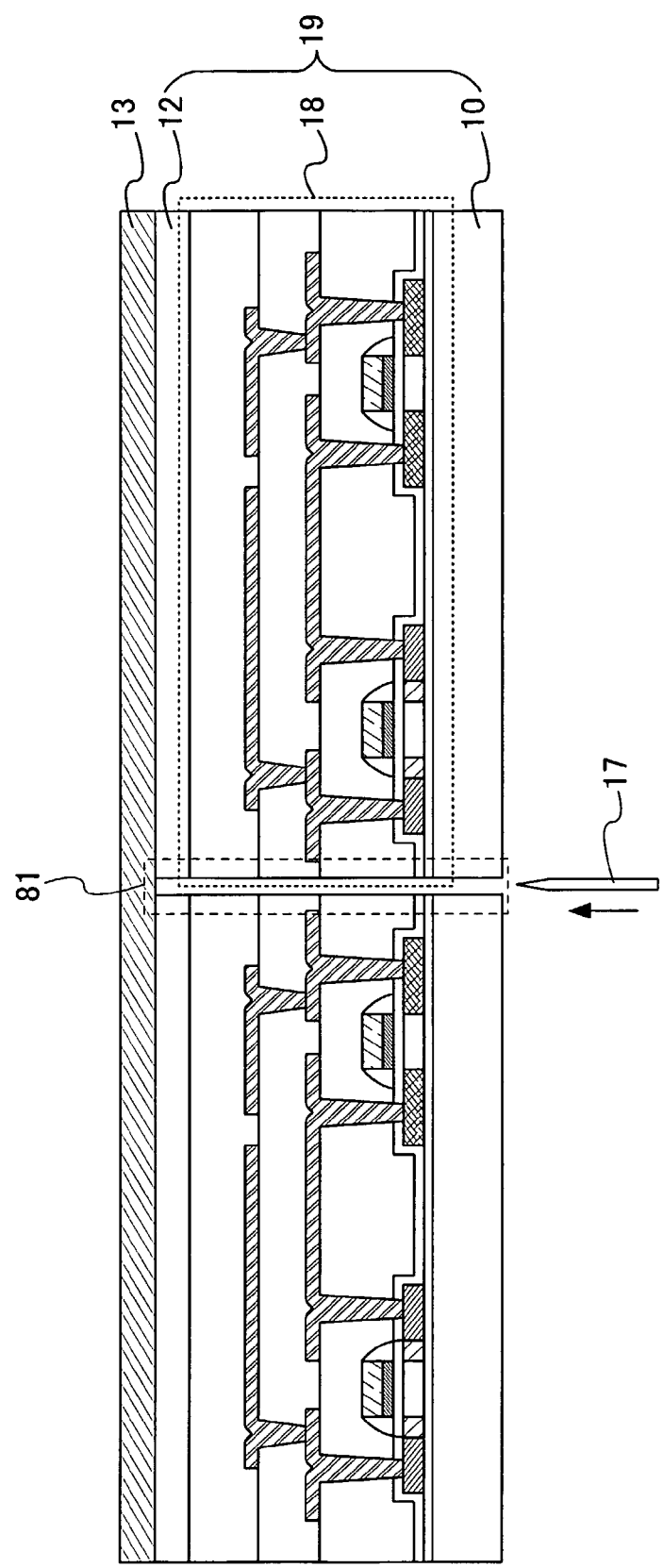
FIG. 11 shows a method for manufacturing an IC chip according to the present invention (Embodiment Mode 4)

Then, an opening portion 81 is formed by cutting the substrate 10, the layer 11 including the plurality of thin film integrated circuits, and the first film 12 by cutting means 17 (refer to FIG. 11 and FIG. 1D). More specifically, the opening portion 81 is formed by cutting the substrate 10, insulating films 61, 66, 67, 68, and 69 in the layer 11 including the plurality of thin film integrated circuits, and the first film 12. At this time, the elements in the layer 11 including the plurality of thin film integrated circuits are not cut.

After the cutting step, a plurality of thin film integrated circuits 18 are formed. Further, a plurality of IC chips 19 are formed in which the substrate 10, the thin film integrated circuits 18, and the first film 12 are stacked.

The steps to be conducted subsequently are as shown in the previous embodiment mode, and the detail is described below.

Figure 16:
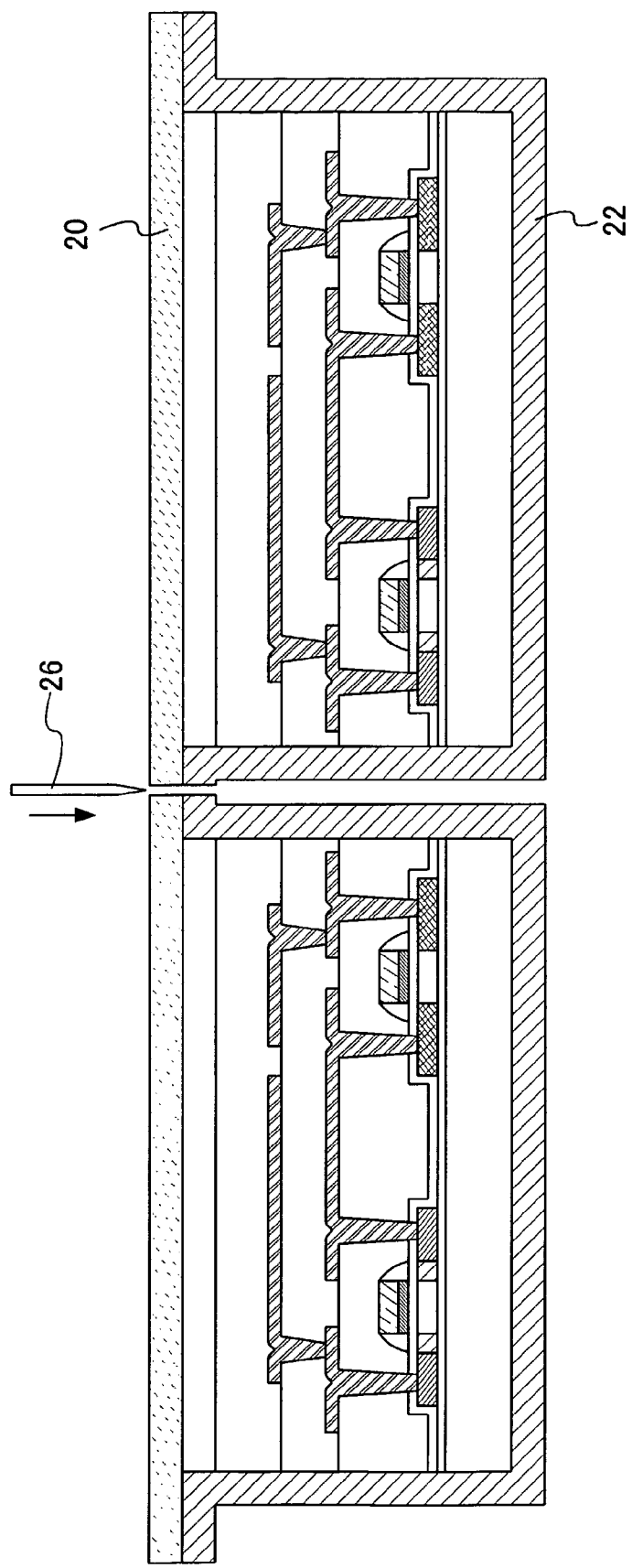
FIG. 16 shows a method for manufacturing an IC chip according to the present invention (Embodiment Mode 4).

Next, the second film 13 is expanded so as to form a space between the IC chips 19 (refer to FIG. 15A and FIG. 2A). Subsequently, the second film 13 is irradiated with light so as to decrease the adhesiveness between the second film 13 and one plane of the IC chip 19. Next, the IC chips 19 are separated from the second film 13, and then the one plane of the IC chip 19 is adhered to a first base 20 (refer to FIG. 15B and FIGS. 2A and 2B). Subsequently, the other plane of the IC chip 19 is adhered to a second base 22 (refer to FIG. 16 and FIGS. 2B and 2C). Next, a portion where the first base 20 and the second base 22 are adhered is cut by cutting means 26. Then, the IC chips 19 sealed by the first base 20 and the second base 22 are completed.

Embodiment 1

A thin film integrated circuit manufactured according to the present invention comprises a plurality of elements and a conductive layer serving as an antenna. The plurality of elements correspond to, for example, a thin film transistor, a capacitor element, a resistor element, a diode, and the like.

Figure 12:
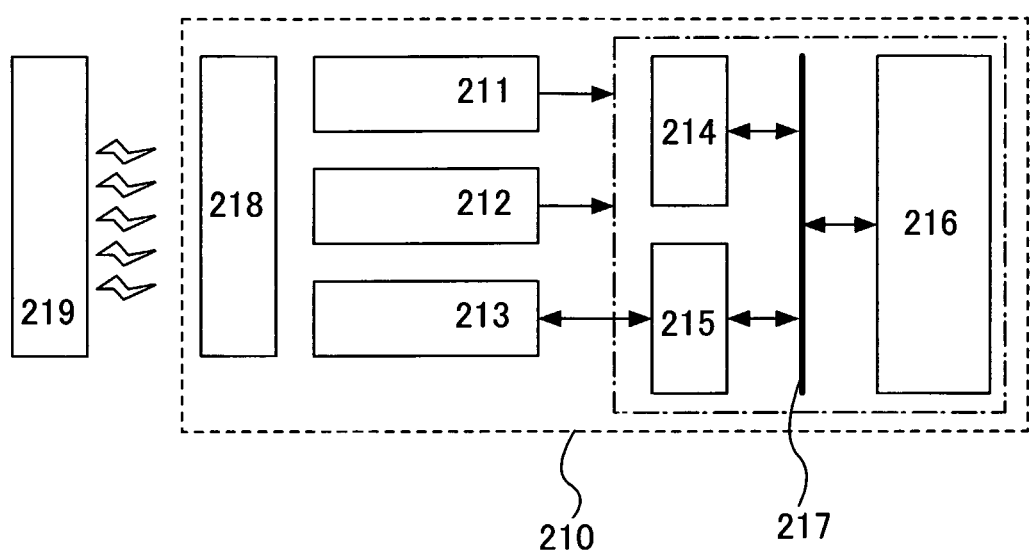
FIG. 12 shows a structure of an IC chip (Embodiment 1)

A thin film integrated circuit 210 included in an IC chip has a function to communicate data in a non-contact way, and the plurality of elements included in the thin film integrated circuit 210 constitute various circuits. For example, the elements have, for example, a power source circuit 211, a clock generator circuit 212, a data demodulator/modulator circuit 213, a control circuit 214, an interface circuit 215, a memory 216, a data bus 217, an antenna (also referred to as an antenna coil) 218, and the like (refer to FIG. 12).

The power source circuit 211 is a circuit for generating electric current or electric voltage which will be supplied to the various circuits based on alternating signals inputted from the antenna 218. The clock generator circuit 212 is a circuit for generating various clocks which will be supplied to the various circuits based on the alternating signals inputted from the antenna 218. The data demodulator/modulator circuit (a circuit including a demodulator circuit and a modulator circuit) 213 has a function for demodulating/modulating the data to be sent to or received from a reader/writer 219. The control circuit 214 corresponds to, for example, a central processing unit (CPU), a microprocessor unit (MPU), or the like, and has a function to control another circuit. The antenna 218 has a function to send and receive an electromagnetic wave. The reader/writer 219 has a function to communicate with the thin film integrated circuit, control the thin film integrated circuit, and process the data sent to or received from the thin film integrated circuit.

Further, the antenna 218 has a function to convert the electromagnetic wave into alternating electric signals. In addition, load modulation is applied to the antenna 218 by the data demodulator/modulator circuit 213. The alternating electric signals generated by the antenna 218 are supplied to the power source circuit 211, the clock generator circuit 212, the data demodulator/modulator circuit 213, and the like.

The circuits that the thin film integrated circuit constitutes are not limited to the above, and the circuits may, for example, further include another constituent element such as a limiter circuit of a power source voltage and hardware only for processing codes.

Embodiment 2

Figure 13A:
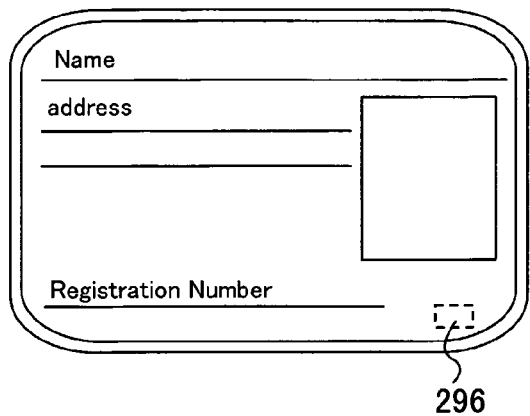
FIGS. 13A to 13E show usage patterns of an IC chip (Embodiment 2)
Figure 13B:
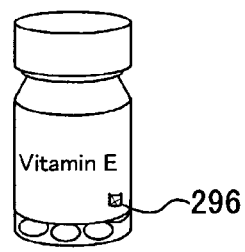
Figure 13C:
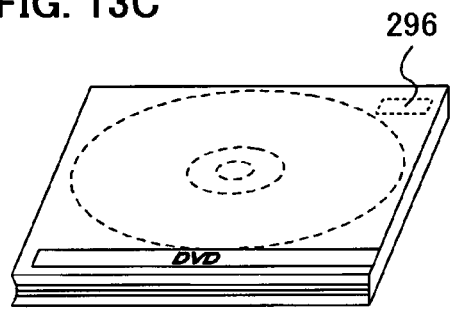
Figure 13D:
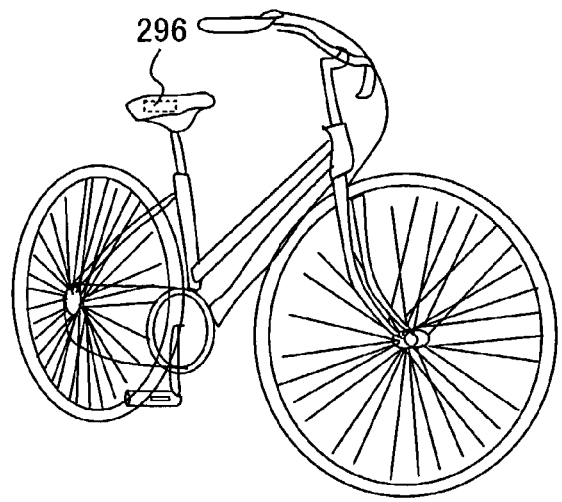
Figure 13E:
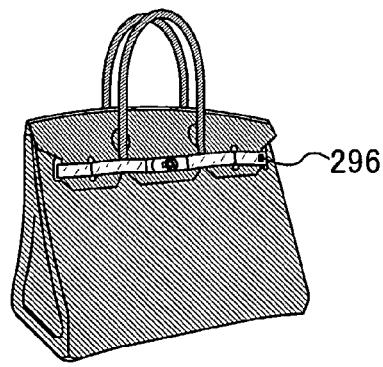

An IC chip 296 including a thin film integrated circuit manufactured according to the present invention is applicable in a wide range. For example, the IC chip 296 can be applied to a banknote, a coin, documents of value, unregistered bonds, identification certificates (driver's license, certificate of residence, and the like, refer to FIG. 13A), pack cases (a pack paper, a bottle, and the like, refer to FIG. 13B), a recording medium (DVD software, a video tape, and the like, refer to FIG. 13C), vehicles (a bicycle and the like, refer to FIG. 13D), personal belongings (a bag, glasses, and the like (refer to FIG. 13E), foods, clothes, general merchandise, electronic appliances, and the like. The electronic appliances are a liquid crystal display device, an EL display device, a television device (also referred to as simply a TV, a TV receiving machine, or a television receiving machine), a mobile phone, and the like.

The thin film integrated circuit and the IC chip including the thin film integrated circuit are fixed to the object by pasting them to the surface of the object or embedding them inside the object. For example, if the object is a book, they are fixed to the book by embedding them inside the paper, and if the object is a package made of an organic resin, they are fixed to the package by embedding them inside the organic resin. By providing the thin film integrated circuit and the IC chip including the thin film integrated circuit inside a banknote, a coin, documents of value, unregistered bonds, identification certificates, and the like, the forgery can be prevented. Moreover, when the thin film integrated circuit and the IC chip including the thin film integrated circuit are provided in pack cases, a recording medium, personal belongings, foods, clothes, general merchandise, electronic appliances, and the like, an inspection system, a system at the rental shop, and the like become more efficient. When the thin film integrated circuit and the IC chip including the thin film integrated circuit are provided in the vehicles, the forgery and stealing can be prevented.

Figure 14A:
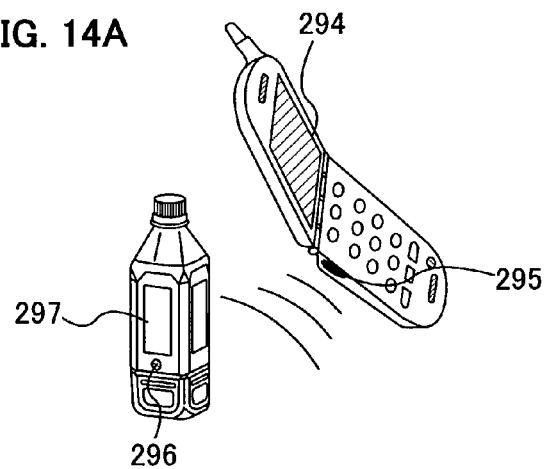
FIGS. 14A and 14B show usage patterns of an IC chip (Embodiment 2)
Figure 14B:
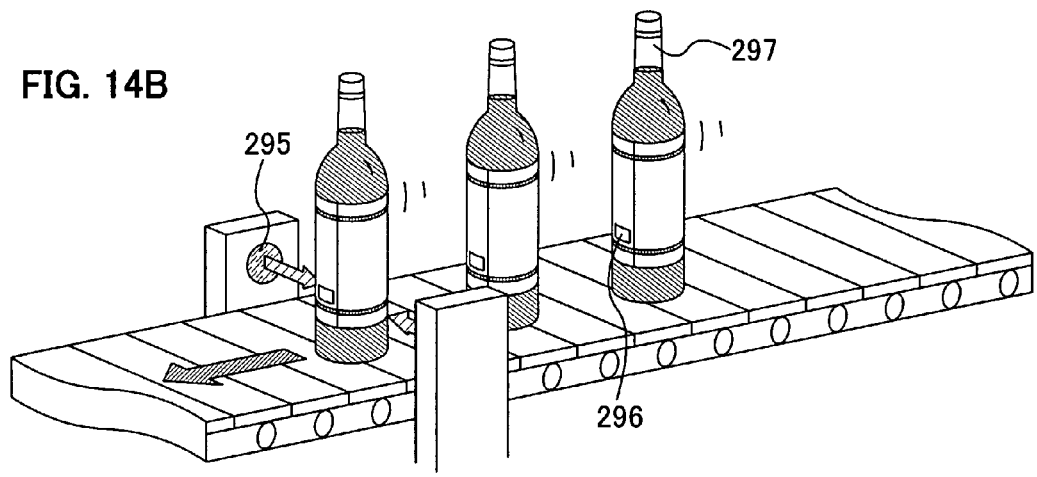

Furthermore, by applying the IC chip including the thin film integrated circuit to a management system and a circulation system of objects, the system can become more sophisticated. For example, an example is given in which a reader/writer 295 is provided at a side surface of a mobile terminal including a display portion 294 and the IC chip 296 including the thin film integrated circuit is provided at a side surface of an object 297 (refer to FIG. 14A). In this system, when the IC chip 296 including the thin film integrated circuit is held over the reader/writer 295, the display portion 294 displays information of the object 297 such as a material, a production area, a history of circulation process, and the like. As another example, the reader/writer 295 is provided beside the belt conveyer (refer to FIG. 14B). In this case, the object 297 can be easily inspected.

Embodiment 3

In many cases, an IC chip has only a thin film integrated circuit between a first film and a second film. However, according to the present invention, the substrate and the thin film integrated circuit are provided between the first film and the second film. This characteristic makes it possible to prevent the intrusion of harmful gas, water, and impurity elements. Therefore, an IC chip in which the deterioration and damage of the thin film integrated circuit are suppressed and the reliability is enhanced can be provided.

The substrate included in the IC chip of the present invention preferably has a thickness of 50 μm or less, more preferably 20 μm or less, and much more preferably 5 μm or less. By conducting the grinding step and the polishing step to thin the substrate so as to have the above thickness, an IC chip having flexibility can be provided.

The substrate 10 corresponds to a glass substrate, a quartz substrate, a plastic substrate, or the like. Among these substrates, the glass substrate is particularly preferable. This is because the glass substrate has advantages, compared with the other substrates, that the grinding and the polishing can be easily conducted, the large substrate can be easily used, and the glass is less expensive. As the material of the plastic substrate, there are mainly a thermoplastic resin and a thermoset resin. The thermoplastic resin corresponds to polyethylene, polypropylene, polystyrene, an AS resin, an ABS resin (a resin in which acrylonitrile, butadiene, and styrene are polymerized), a methacrylic resin (also referred to as acrylic), polyvinyl chloride, polyacetal, polyamide, polycarbonate, modified polyphenylene ether, polybutylene terephthalate, polyethylene terephthalate, polysulfone, polyethersulfone, polyphenylene sulfide, polyamide-imide, polymethylpentene, or the like. The thermoset resin corresponds to a phenol resin, a urea resin, a melamine resin, an epoxy resin, a diallyl phthalate resin, an unsaturated polyester resin, polyimide, polyurethane, or the like.

Each of the first film 12, the second film 13, the first base 20, the second base 22, the film 33, the first tape 40, and the second tape 41 corresponds to a material such as polypropylene, polyester, vinyl, polyvinyl fluoride, vinyl chloride, ethylene vinyl acetate, urethane, or polyethylene terephthalate, a paper made of a fiber material, or the like. The surfaces of the films, the bases, and the tapes may be coated with powder of silicon dioxide (silica). Because of the coating, water-resistant properties can be kept even under a high-temperature and high-humidity environment. Since the coating material holds electrostatic, the thin film integrated circuit can be protected from the electrostatic. Moreover, the surfaces may be coated with a conductive material such as indium tin oxide. Furthermore, the surfaces may be coated with thin film mainly containing carbon (e.g. a diamond-like carbon film). The strength can be increased by the coating, and the damage of the thin film integrated circuit can be suppressed. The surfaces may have adhesive planes on which an adhesive agent such as a thermoset resin, an ultraviolet curable resin, or an epoxy resin adhesive agent is applied. Each of the first film 12, the second film 13, the first base 20, the second base 22, the film 33, the first tape 40, and the second tape 41 may have light-transmitting properties. All of the first film 12, the second film 13, the film 33, the first base 20, the second base 22, the first tape 40, and the second tape 41 are formed with the same function. Therefore, the base and the tape correspond to the film.

The present invention comprises the step of polishing the ground surface of the substrate 10 by the polishing means 16 (refer to FIG. 1C). The thickness of the polished substrate 10 is not limited in particular; however, it is preferable that the thickness be 50 μm or less, more preferably 20 μm or less, and much more preferably 5 μm or less. The thickness of the polished substrate 10 may be determined appropriately in consideration of the strength of the polished IC chip, the time required for the polishing step, the time required for the cutting step, the application of the IC chip, and the like.

For example, in the case of improving the productivity by shortening the time of the polishing step, the thickness of the polished substrate 10 is preferably set to approximately 50 μm. In the case of pasting or embedding the IC chip to a thin object, the thickness of the polished substrate 10 is preferably set to approximately 20 μm or less, more preferably 5 μm or less. In the case of improving the productivity by shortening the time of the cutting step, the thickness of the polished substrate 10 is preferably set to approximately 20 μm or less, more preferably 5 μm or less.

The present invention comprises the step of forming the thin film integrated circuit over one plane of the substrate. However, the structure of the thin film integrated circuit is different depending on the application of the IC chip. For example, when an IC chip for sending and receiving the electromagnetic wave is manufactured, a plurality of elements (a thin film transistor, a capacitor element, a resistor element, and the like) and a conductive layer serving as an antenna are formed as the thin film integrated circuit. Moreover, when an IC chip for storing data is manufactured, a storage element and a plurality of elements (a thin film transistor, a capacitor element, a resistor element, and the like) for controlling the storage element are formed as the thin film integrated circuit. When an IC chip for controlling circuits or generating signals (such as a CPU, a signal generator circuit, and the like) is manufactured, a plurality of elements (a thin film transistor, a capacitor element, a resistor element, and the like) are formed as the thin film integrated circuit.

The invention claimed is:

1. A method for manufacturing IC chips, comprising:
   forming a thin film integrated circuit including an insulating layer, a plurality of elements and a conductive layer over one surface of a glass substrate;
   providing a first film over the thin film integrated circuit;
   providing a second film over the first film;
   grinding a surface opposite to the one surface of the glass substrate;
   polishing the surface opposite to the one surface of the glass substrate which has been ground;
   cutting the glass substrate, the insulating layer, and the first film without cutting the second film so as to form a plurality of IC chips in which the glass substrate, the thin film integrated circuit, and the first film are stacked;
   expanding the second film so as to form a space between the IC chips;
   providing a base on the surface opposite to the one surface of the glass substrate of the IC chips;
   heating the base for adhering the surface opposite to the one surface of the glass substrate of the IC chips to the base;
   irradiating the second film with light after heating the base for adhering; and
   separating the IC chips from the second film.

2. A method for manufacturing IC chips, comprising:
   forming a thin film integrated circuit including an insulating layer, a plurality of elements and a conductive layer over one surface of a glass substrate;
   providing a first film over the thin film integrated circuit;
   providing a second film over the first film;
   grinding a surface opposite to the one surface of the glass substrate;
   polishing the surface opposite to the one surface of the glass substrate, which has been ground;
   cutting the glass substrate, the insulating layer, and the first film without cutting the second film so as to form a plurality of IC chips in which the glass substrate, the thin film integrated circuit, and the first film are stacked;

expanding the second film so as to form a space between the IC chips;
irradiating the second film with light;
providing a base on the surface opposite to the one surface of the glass substrate of the IC chips after irradiating the second film with light;
heating the base for adhering the surface opposite to the one surface of the glass substrate of the IC chips to the base; and
separating the IC chips from the second film after heating the base for adhering.

3. A method for manufacturing IC chips, comprising:
forming a thin film integrated circuit including an insulating layer and a plurality of elements over one surface of a glass substrate;
providing a first film over the thin film integrated circuit;
providing a second film over the first film;
grinding a surface opposite to the one surface of the glass substrate;
polishing the surface opposite to the one surface of the glass substrate, which has been ground;
cutting the glass substrate, the insulating layer, and the first film without cutting the second film so as to form a plurality of IC chips in which the glass substrate, the thin film integrated circuit, and the first film are stacked;
expanding the second film so as to form a space between the IC chips;
providing a first base on the surface opposite to the one surface of the glass substrate of the IC chips;
heating the first base for adhering the surface opposite to the one surface of the glass substrate of the IC chips to the first base;
irradiating the second film with light after heating the first base for adhering;
separating the IC chips from the second film;
adhering a second base to the first film of the IC chips; and
laminating the IC chips by a laminate roll having one or both of heating means and pressurizing means so as to seal the IC chips by the first base and the second base.

4. A method for manufacturing IC chips, comprising:
forming a thin film integrated circuit including an insulating layer and a plurality of elements and a conductive layer over one surface of a glass substrate;
providing a first film over the thin film integrated circuit;
providing a second film over the first film;
grinding a surface opposite to the one surface of the glass substrate;
polishing the surface opposite to the one surface of the glass substrate, which has been ground;
cutting the glass substrate, the insulating layer, and the first film without cutting the second film so as to form a plurality of IC chips in which the glass substrate, the thin film integrated circuit, and the first film are stacked;
expanding the second film so as to form a space between the IC chips of the plurality of IC chips;
irradiating the second film with light;
providing a first base on the surface opposite to the one surface of the glass substrate of the IC chips after irradiating the second film with light;
heating the first base for adhering the surface opposite to the one surface of the glass substrate of the IC chips to the first base;
separating the IC chips from the second film after heating the first base for adhering;
adhering a second base to the first film of the IC chips; and
laminating the IC chips by a laminate roll having one or both of heating means and pressurizing means so as to seal the IC chips by the first base and the second base.

5. The method for manufacturing IC chips according to any one of claims 1 to 4,
wherein the surface opposite to the one surface of the glass substrate is ground until a thickness of the glass substrate becomes 100 μm or less.

6. The method for manufacturing IC chips according to any one of claims 1 to 4,
wherein the surface opposite to the one surface of the glass substrate is polished until a thickness of the glass substrate becomes 20 μm or less.

7. The method for manufacturing IC chips according to any one of claims 1 to 2, the base comprises an organic material.

8. The method for manufacturing IC chips according to any one of claims 3 to 4, the first base or the second base comprises an organic material.

9. The method for manufacturing IC chips according to any one of claims 1 to 2, a surface of the base is coated with powder of silicon dioxide, a conductive material, or a thin film mainly containing carbon.

10. The method for manufacturing IC chips according to any one of claims 3 to 4, a surface of the first base or the second base is coated with powder of silicon dioxide, a conductive material, or a thin film mainly containing carbon.

11. The method for manufacturing IC chips according to any one of claims 3 to 4, further comprising: cutting the first base and the second base between two chips of the IC chips where the first base and the second base are adhered with each other by the laminating step.

* * * * *

UNITED STATES PATENT AND TRADEMARK OFFICE
CERTIFICATE OF CORRECTION

| | | |
|---|---|---|
| PATENT NO. | : 8,426,293 B2 | Page 1 of 1 |
| APPLICATION NO. | : 11/629861 | |
| DATED | : April 23, 2013 | |
| INVENTOR(S) | : Tsurume et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 990 days.

Signed and Sealed this
Sixteenth Day of December, 2014

Michelle K. Lee
*Deputy Director of the United States Patent and Trademark Office*